(12) United States Patent
Lin et al.

(10) Patent No.: US 10,412,866 B2
(45) Date of Patent: Sep. 10, 2019

(54) COVER FILM

(71) Applicant: ASIA ELECTRONIC MATERIAL CO., LTD., Hsinchu County (TW)

(72) Inventors: Chih-Ming Lin, Zhubei (TW); Hui-Feng Lin, Zhubei (TW); Chien-Hui Lee, Zhubei (TW)

(73) Assignee: ASIA ELECTRONIC MATERIAL CO., LTD., Hsinchu County (TW)

(*) Notice: Subject to any disclaimer, the term of this patent is extended or adjusted under 35 U.S.C. 154(b) by 0 days.

(21) Appl. No.: 15/971,129

(22) Filed: May 4, 2018

(65) Prior Publication Data

US 2018/0255668 A1 Sep. 6, 2018

Related U.S. Application Data

(62) Division of application No. 14/882,753, filed on Oct. 14, 2015.

(30) Foreign Application Priority Data

Oct. 15, 2014 (CN) .......................... 2014 1 0545233
Oct. 15, 2014 (CN) ..................... 2014 2 0596633 U

(51) Int. Cl.
*H05K 9/00* (2006.01)
*H05K 1/02* (2006.01)

(52) U.S. Cl.
CPC ......... *H05K 9/0088* (2013.01); *H05K 1/0218* (2013.01)

(58) Field of Classification Search
CPC ........................... H05K 9/0088; H05K 1/0218
See application file for complete search history.

(56) References Cited

U.S. PATENT DOCUMENTS

2003/0155143 A1\* 8/2003 Fujieda .................. B82Y 10/00
174/354

FOREIGN PATENT DOCUMENTS

JP        2004-095566       3/2004
JP        2004095566 A  \* 3/2004

OTHER PUBLICATIONS

English translation of JP 2004-295566.\*
Non-Final Office Action for U.S. Appl. No. 14/882,753 dated Sep. 5, 2017.
Final Office Action for U.S. Appl. No. 14/882,753, dated Feb. 7, 2018.

\* cited by examiner

*Primary Examiner* — Victor S Chang
(74) *Attorney, Agent, or Firm* — Amin, Turocy & Watson LLP

(57) ABSTRACT

The present disclosure provides a cover film, including a conductive adhesive layer, an electromagnetic shielding layer formed on the conductive adhesive layer, and an insulating layer formed on the electromagnetic shielding layer. The electromagnetic shielding layer has a thickness of from 0.01 to 25 micrometers, such that the cover film can shield electromagnetic interference through the thinner interposed electromagnetic shielding layer.

3 Claims, 2 Drawing Sheets

COVER FILM

CROSS-REFERENCE TO RELATED APPLICATIONS

This application is a Divisional of application Ser. No. 14/882,753 filed on Oct. 14, 2015, the entire contents of which are incorporated herein by reference.

This application is based upon and claims the benefit of priority from Chinese Patent Applications No. 201410545233.X and 201420596633.9, both filed Oct. 15, 2014, the entire contents of which are incorporated herein by reference.

BACKGROUND OF THE INVENTION

1. Field of the Invention

The present disclosure relates to a cover film, and more particularly, to a cover film with an electromagnetic shielding property.

2. Description of Related Art

Recently, it has become a trend to develop in small consumer electronics with compact size, light weight as well as degrees of freedom. Therefore, flexible printed circuit boards (FPCB) are utilized in smart phone and touch panel due to the characteristics of light weight, thinness, high degrees of freedom and flexibility.

In order to properly operate with high speed transmission of signals, wirings are designed to be more aggregated such that the spacing between two adjacent wires is smaller. However, the problem of electromagnetic interference would get worse due to the decreased spacing, the higher operating frequency, and the unreasonable circuit arrangement.

In some designs, an electromagnetic shielding layer is added on a cover film or a solder resist which is attached on a circuit board by glue for shielding electromagnetic interference from outside or internal signal noises. Nevertheless, the process is more complex and time-consuming, and results in lack of protection for the electromagnetic shielding layer. Therefore, there is a need to develop a thinner cover film for shielding electromagnetic interference.

SUMMARY OF THE INVENTION

The present disclosure provides a cover film, comprising a conductive adhesive layer, an electromagnetic shielding layer formed on the conductive adhesive layer, and an insulating layer formed on the electromagnetic shielding layer, wherein the electromagnetic shielding layer has a thickness of from 0.01 to 25 micrometers.

In one preferable embodiment, the thickness of the electromagnetic shielding layer is from 0.01 to 1.5 micrometers.

In an embodiment, a thickness of the insulating layer is between 3 to 75 micrometers.

In an embodiment, the insulating layer comprises a first polymer and an additive dispersed in the first polymer, wherein a content of the additive is between 3 wt % to 15 wt % of the insulating layer, and wherein the first polymer is at least one selected from the group consisting of an epoxy resin, an acrylic resin and a combination thereof, and the additive is at least one selected from the group consisting of carbon powder, titanium dioxide, a colorant, a pigment and a combination thereof.

In an embodiment, the electromagnetic shielding layer is made of metal or a resin containing metal powder. In an embodiment, the electromagnetic shielding layer is formed on the conductive adhesive layer by coating, vapor deposition or magnetron sputtering.

In an embodiment, a thickness of the conductive adhesive layer is between 3 to 50 micrometers, wherein the conductive adhesive layer comprises a second polymer and at least one conductive powder dispersed in the second polymer, and wherein a content of the conductive powder is between 0.5 wt % to 90 wt % of the conductive adhesive layer. In one preferred embodiment, the second polymer is at least one selected from the group consisting of an epoxy resin, a poly-p-xylene resin, a bismaleimide resin, a polyimide resin, an acrylic resin, a urethane resin, a silicon rubber-based resin and a combination thereof. Preferably, the second polymer is an epoxy resin or an acrylic resin.

In an embodiment, the at least one conductive powder is at least one selected from the group consisting of gold powder, silver powder, copper powder, nickel powder, aluminum powder, silver coated copper powder, silver coated nickel powder, copper-nickel alloy, iron powder, iron-based alloy, silver-copper alloy, tin-copper alloy, gold plated nickel powder, and silver plated copper powder.

In another embodiment, the cover film further comprises an electromagnetic absorption layer formed between the electromagnetic shielding layer and the insulating layer, wherein the electromagnetic absorption layer has a thickness of from 0.1 to 25 micrometers.

In an embodiment, the electromagnetic absorption layer comprises a third polymer and at least one magnetic powder dispersed in the third polymer, wherein a content of the at least one magnetic powder is between 50 wt % to 90 wt % of the electromagnetic absorption layer, and the electromagnetic absorption layer is formed by filling, laminating or coating.

In an embodiment, the at least one magnetic powder is at least one selected from the group consisting of iron oxide, iron-silicon-aluminum alloy, permalloy (iron-nickel alloy), and iron-silicon-chrome-nickel alloy. In one embodiment, the third polymer is selected from the group consisting of an epoxy resin, a poly-p-xylene resin, a bismaleimide resin, a polyimide resin, an acrylic resin, a urethane resin and a silicon rubber-based resin and a combination thereof. Preferably, the third polymer is an epoxy resin or an acrylic resin.

In another embodiment, the cover film further comprises a release layer formed under the conductive adhesive layer such that the conductive adhesive layer is sandwiched between the electromagnetic shielding layer and the release layer, wherein the release layer has a thickness of from 25 to 100 micrometers. In a preferred embodiment, the release layer is a polyethylene terephthalate (PET) fluorine release film, a PET silicone oil release film, a PET matte release film or a polyethylene release film.

According to the present disclosure, an overall thickness of the FPCB can be reduced through forming the thinner interposed electromagnetic shielding layer having a thickness of from 0.01 to 25 micrometers. Furthermore, the electromagnetic shielding layer can be formed by coating, vapor deposition or magnetron sputtering in one single process such that the process of the cover film is simplified.

As such, the cover film of the present disclosure has an effect of preventing not only electromagnetic interference resulting from the internal signal transmission but also electromagnetic spillover by forming the electromagnetic absorption layer having a thickness of from 0.1 to 25 micrometers with a limited increased thickness.

DETAILED DESCRIPTION OF THE PREFERRED EMBODIMENTS

The detailed description of the present disclosure is illustrated by the following specific examples. Persons skilled in the art can conceive the other advantages and effects of the present disclosure based on the content contained in the specification of the present disclosure. It should be noted that all the drawings are not intended to limit the present disclosure. Various modifications and variations can be made without departing from the spirit of the present disclosure. Further, terms such as "first," "second," "on," "a," etc. are merely for illustrative purposes and should not be construed to limit the scope of the present disclosure.

First Embodiment

Figure 1:
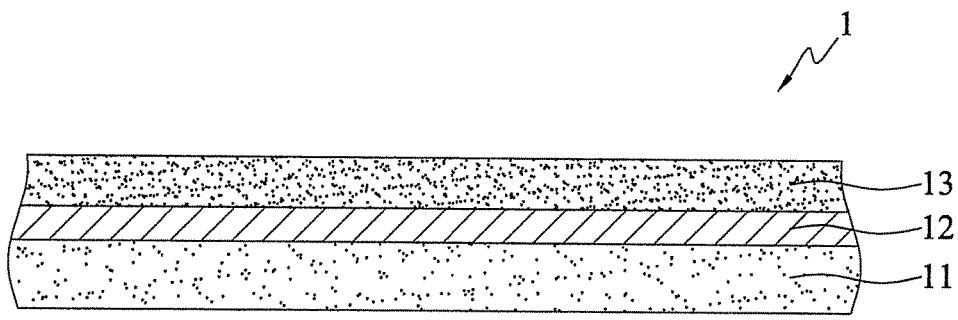
FIG. 1 is a cross-sectional schematic view of a cover film according to a first embodiment of the present disclosure.

FIG. 1 is a cross-sectional schematic view of a cover film 1 of the present disclosure, comprising a conductive adhesive layer 11, an electromagnetic shielding layer 12 formed on the conductive adhesive layer 11, and an insulating layer 13 formed on the electromagnetic shielding layer 12, wherein the electromagnetic shielding layer 12 has a thickness of from 0.01 to 25 micrometers.

In this embodiment, the insulating layer 13 having a thickness of from 3 to 75 micrometers is provided. The insulating layer 13 comprises a first polymer and an additive dispersed in the first polymer, wherein a content of the additive is between 3 wt % to 15 wt % of the insulating layer. In a preferred embodiment, the first polymer is at least one selected from the group consisting of an epoxy resin, an acrylic resin and a combination thereof.

Further, the electromagnetic shielding layer 12 having a thickness of from 0.01 to 25 micrometers is formed on the conductive adhesive layer 11, and the thickness of the electromagnetic shielding layer 12 is preferably from 0.01 to 1.5 micrometers.

The conductive adhesive layer 11 has a thickness of from 3 to 50 micrometers and comprises a second polymer and at least one conductive powder dispersed in the second polymer, wherein a content of the conductive powder is between 0.5 wt % to 90 wt % of the conductive adhesive layer. In a preferred embodiment, the second polymer is at least one selected from the group consisting of an epoxy resin, a poly-p-xylene resin, a bismaleimide resin, a polyimide resin, an acrylic resin, a urethane resin and a silicon rubber-based resin and a combination thereof. Preferably, the second polymer is an epoxy resin or an acrylic resin.

Also, the at least one conductive powder is at least one selected from the group consisting of gold powder, silver powder, copper powder, nickel powder, aluminum powder, silver coated copper powder, silver coated nickel powder, copper-nickel alloy, iron powder, iron-based alloys, silver-copper alloy, tin-copper alloy, gold plated nickel powder, and silver plated copper powder.

Figure 2:
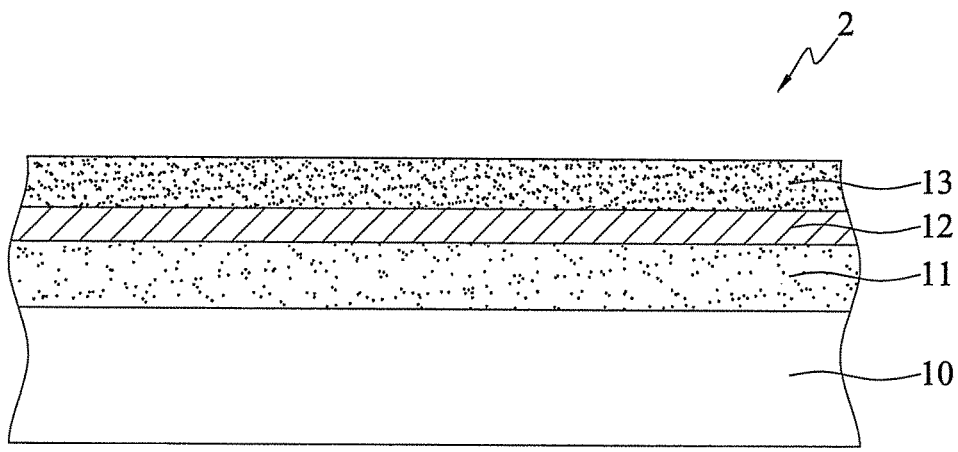
FIG. 2 is a cross-sectional schematic view of a cover film according to another example of the first embodiment of the present disclosure.

Referring to FIG. 2, in order to keep adhesiveness of the conductive adhesive layer 11, the cover film 2 of the present disclosure further comprises a release layer 10 formed under the conductive adhesive layer 11 such that the conductive adhesive layer 11 is sandwiched between the electromagnetic shielding layer 12 and the release layer 10. When the cover film 2 is needed to be attached to FPCB, the release layer 10 is then removed.

Second Embodiment

Figure 3:
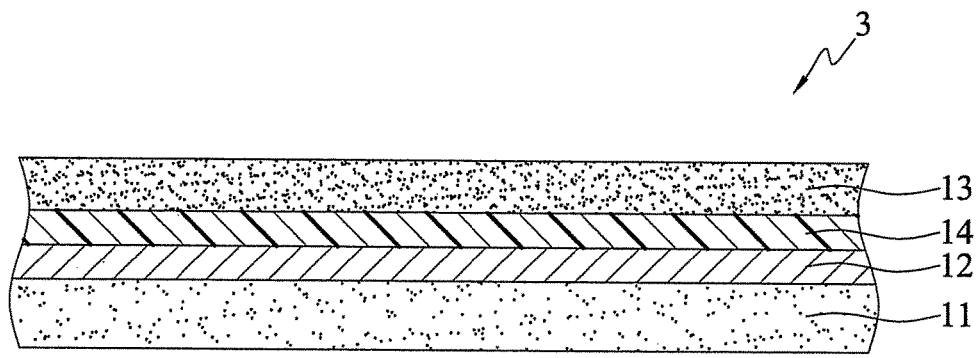
FIG. 3 is a cross-sectional schematic view of a cover film according to a second embodiment of the present disclosure.

As shown in FIG. 3, a cover film 3 according to the present disclosure further comprises an electromagnetic absorption layer 14 formed between the electromagnetic shielding layer 12 and the insulating layer 13. In this embodiment, the electromagnetic absorption layer 14 has a thickness of from 0.1 to 25 micrometers.

In this embodiment, the electromagnetic absorption layer 14 comprises a third polymer and at least one magnetic powder dispersed in the third polymer, wherein the at least one magnetic powder is at least one selected from the group consisting of iron oxide, iron-silicon-aluminum alloy, permalloy (iron-nickel alloy), and iron-silicon-chrome-nickel alloy.

In this embodiment, the third polymer is at least one selected from the group consisting of an epoxy resin, a poly-p-xylene resin, a bismaleimide resin, a polyimide resin, an acrylic resin, a urethane resin, a silicon rubber-based resin and a combination thereof. More preferably, the third polymer is an epoxy resin or an acrylic resin.

The structure of the cover film 3 of this embodiment is similar to that of the cover film 1 of the first embodiment, and the difference is in that the additional electromagnetic absorption layer 14 having a thickness of from 0.1 to 25 micrometers is interposed between the insulating layer 13 and the electromagnetic shielding layer 12.

Preferably, the electromagnetic shielding layer 12 has a thickness of from 0.01 to 1.5 micrometers, and the electromagnetic shielding layer 12 is made of metal such as gold, copper, zinc, nickel or aluminum.

In the embodiment, a conductive adhesive layer 11 is formed under the electromagnetic shielding layer 12, and a thickness of the conductive adhesive layer 11 is from 3 to 50 micrometers. The conductive adhesive layer 11 comprises a second polymer and at least one conductive powder dispersed in the second polymer, wherein a content of the conductive powder is between 0.5 wt % to 90 wt % of the conductive adhesive layer. In a preferred embodiment, the second polymer is at least one selected from the group consisting of an epoxy resin, a poly-p-xylene resin, a bismaleimide resin, a polyimide resin, an acrylic resin, a urethane resin, a silicon rubber-based resin and a combination thereof. More preferably, the second polymer is an epoxy resin or an acrylic resin. The at least one conductive powder is at least one selected from the group consisting of gold powder, silver powder, copper powder, nickel powder, aluminum powder, silver coated copper powder, silver coated nickel powder, copper-nickel alloy, iron powder, iron-based alloy, silver-copper alloy, tin-copper alloy, gold plated nickel powder, and silver plated copper powder.

Figure 4:
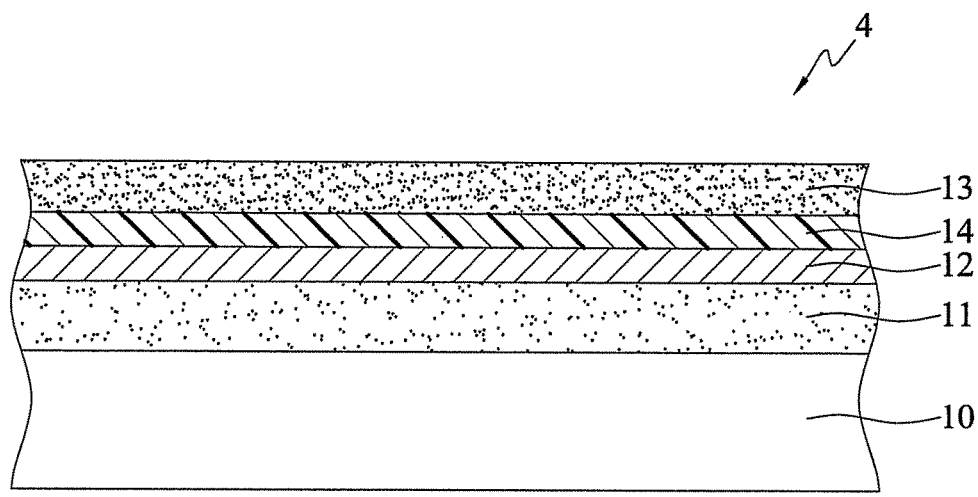
FIG. 4 is a cross-sectional schematic view of a cover film according to another example of the second embodiment of the present disclosure.

Referring to FIG. 4, in order to keep adhesiveness of the conductive adhesive layer 11, the cover film 4 of the present disclosure further comprises a release layer 10 formed under the conductive adhesive layer 11 such that the conductive adhesive layer 11 is sandwiched between the electromagnetic shielding layer 12 and the release layer 10. When the cover film 4 is needed to be attached to FPCB, the release layer 10 is then removed.

Examples 1 to 2: The Manufacture of the Cover Film of the First Embodiment of the Present Disclosure The cover films of the present disclosure were made according to the thickness described in Table 1 and the manufacturing method described below.

First, an insulating layer comprising an epoxy resin (Dupont; APLUS-1) and titanium dioxide powder (Dupont; R906) dispersed in the epoxy resin was provided, wherein a content of the titanium dioxide powder is 10 wt % of the insulating layer. Then, an acrylic resin (Asia Electronic Materials Co., Ltd., AEM Co.; RD0351) containing 85 wt % of silver coated copper powder (AEM Co.; EI-0007) was coated on the insulating layer. Afterwards, the acrylic resin was baked at a temperature of 50° C. for 5 minutes to form an electromagnetic shielding layer having a thickness as shown in Table 1. Subsequently, a conductive paint was coated on the electromagnetic shielding layer, wherein the conductive paint was prepared through mixing an epoxy resin (Dupont; APLUS-1) and a metal powder (Union Chemical Ind. Co. Ltd.; A-3). The conductive paint was dried to form the conductive adhesive layer having a content of 60 wt % of the metal powder. The cover film of the first embodiment of the present disclosure was then obtained.

Examples 3 to 5: The Manufacture of the Cover Film of the First Embodiment of the Present Disclosure The cover films of Examples 3 to 5 were prepared according to the method described in Examples 1 and 2, except that 10 wt % of titanium dioxide powder was replaced by 15 wt % of carbon black (CABOT company; REGAL®400R).

In addition, a release layer (Mitsubishi; F38) was attached under the conductive adhesive layer in Examples 4 and 5.

Examples 6 to 7: The Manufacture of the Cover Film of the Second Embodiment of the Present Disclosure First, the cover films of Examples 6 to 7 were prepared according to the thickness described in Table 1 below and the manufacturing method previously described, except that an electromagnetic absorption layer was formed prior to the formation of the electromagnetic shielding layer. The electromagnetic absorption layer comprising an acrylic resin, and 85 wt % of iron-silicon-aluminum alloy (Sanyo; HY-008) was formed followed by applying the resin mixture and baking at a temperature of 50° C. for 5 minutes. Then, the electromagnetic shielding layer and the conductive adhesive layer were formed sequentially to obtain the cover film of the second embodiment.

Examples 8 to 10: The Manufacture of the Cover Film of the Second Embodiment of the Present Disclosure The cover films of Examples 8 to 10 were prepared according to the method described in Examples 6 and 7, except that 10 wt % of titanium dioxide powder was replaced by 15 wt % of carbon black (CABOT company; REGAL® 400R).

In addition, a release layer (Mitsubishi; F38) was attached on the conductive adhesive layer in Examples 9 and 10.

Comparative Example 1

The cover film of the Comparative Example 1 was prepared according to the method described in Example 1 above and the thickness described in Table 1 below, except that no electromagnetic shielding layer was formed and the insulating layer was made of polyurethane (Uncore Company; XC0208BB2500).

TABLE 1

|  | Thickness (μm) | | | | |
| --- | --- | --- | --- | --- | --- |
|  | Conductive adhesive layer | Electromagnetic shielding layer | Electromagnetic absorption layer | Insulating layer | Release layer |
| Example 1 | 3 | 1 | — | 3 | — |
| Example 2 | 4 | 2 | — | 3 | — |
| Example 3 | 5 | 3 | — | 4 | — |
| Example 4 | 6 | 4 | — | 5 | 50 |
| Example 5 | 7 | 5 | — | 6 | 50 |
| Example 6 | 8 | 6 | 5 | 7 | — |
| Example 7 | 9 | 7 | 6 | 8 | — |
| Example 8 | 10 | 8 | 7 | 9 | — |
| Example 9 | 11 | 9 | 8 | 10 | 50 |
| Example 10 | 12 | 10 | 9 | 11 | 50 |
| Comparative Example 1 | 25 | — | — | 20 | 75 |

Test Example

The mechanical property and electrical property of the cover films of Examples 1 to 10 and Comparative example 1 were measured. The test items include thermal stress, dielectric loss, dielectric constant and electromagnetic shielding efficiency. The dielectric loss and dielectric constant were measured by a cavity resonator (Waveguide Resonators) according to the measurement of ASTM 2520, and the thermal stress and the electromagnetic shielding efficiency were measured in accordance with the following conditions.

The Electromagnetic Shielding Efficiency:

According to the measurement of ASTM D4935-99, a coaxial transmission line holder and network analyzer (Wiltron 37225B) were used to measure the electromagnetic shielding efficiency under an operating frequency of from 30 MHz to 1.5 GHz and 40 MHz to 13.5 GHz.

Test of the Thermal Stress:

According to the measurement of IPC-TM-650-2.4.13, the sample was pre-dried in an oven (at 121° C. to 149° C.) for 6 hours, and the sample was removed from the oven to cool down to room temperature. Then, the sample was exposed to solder float at 288° C. for 10 seconds, followed by observation as to whether the exterior appearance of the sample changes visually. The results were summarized in Table 2.

TABLE 2

|  | Dielectric constant (Dk) | Dielectric loss (Df) | Electromagnetic shielding efficiency (dB) | Thermal stress test* |
|---|---|---|---|---|
| Example 1 | 2.5 | 0.025 | −50 | ○ |
| Example 2 | 2.6 | 0.032 | −50 | ○ |
| Example 3 | 2.7 | 0.031 | −50 | ○ |
| Example 4 | 2.8 | 0.037 | −50 | ○ |
| Example 5 | 2.9 | 0.041 | −50 | ○ |
| Example 6 | 3.0 | 0.044 | −55 | ○ |
| Example 7 | 3.1 | 0.056 | −55 | ○ |
| Example 8 | 3.2 | 0.064 | −55 | ○ |
| Example 9 | 3.3 | 0.087 | −55 | ○ |
| Example 10 | 3.4 | 0.089 | −55 | ○ |
| Comparative Example 1 | 4.5 | 0.2 | −42 | ○ |

*○No change

As illustrated in the result of Table 2, each of the cover films of Examples 1 to 3 has a lower dielectric constant and dielectric loss in comparison with the cover film of Comparative Example 1. Although the thickness of each of the cover films of Examples 6 to 10 is higher and an additional electromagnetic absorption layer is attached, the cover films of Examples 6 to 10 show a limited increasing trend in dielectric constant and dielectric loss. In addition, the cover films of Examples 6 to 10 show a superior characteristic of electromagnetic shielding.

The above-described descriptions of the specific embodiments are intended to illustrate the preferred implementation according to the present disclosure but are not intended to limit the scope of the present disclosure. Accordingly, all modifications and variations completed by those with ordinary skill in the art should fall within the scope of present disclosure defined by the appended claims.

What is claimed is:

1. A cover film, comprising:
   a conductive adhesive layer;
   an electromagnetic shielding layer formed on the conductive adhesive layer and having a thickness of 0.01 to 25 micrometers;
   an electromagnetic absorption layer formed on the electromagnetic shielding layer, wherein the electromagnetic shielding layer is sandwiched between the conductive adhesive layer and the electromagnetic absorption layer, and wherein the electromagnetic absorption layer has a thickness of from 0.1 to 25 micrometers; and
   an insulating layer formed on the electromagnetic shielding layer, wherein the electromagnetic absorption layer is sandwiched between the electromagnetic shielding layer and the insulating layer.

2. The cover film of claim 1, wherein the electromagnetic absorption layer comprises a third polymer and at least one magnetic powder dispersed in the third polymer.

3. The cover film of claim 2, wherein the at least one magnetic powder is at least one selected from the group consisting of iron oxide, iron-silicon-aluminum alloy, permalloy (iron-nickel alloy), and iron-silicon-chrome-nickel alloy.

* * * * *